United States Patent
Han et al.

(10) Patent No.: US 9,269,569 B1
(45) Date of Patent: Feb. 23, 2016

(54) LOW DEFECT DENSITY LATTICE-MISMATCHED SEMICONDUCTOR DEVICES AND METHODS OF FABRICATING SAME

(75) Inventors: Sang M. Han, Albuquerque, NM (US); Darin Leonhardt, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 406 days.

(21) Appl. No.: 13/444,712

(22) Filed: Apr. 11, 2012

Related U.S. Application Data

(60) Provisional application No. 61/474,005, filed on Apr. 11, 2011.

(51) Int. Cl.
| | |
|---|---|
| *H01L 29/165* | (2006.01) |
| *H01L 21/20* | (2006.01) |
| *H01L 21/02* | (2006.01) |

(52) U.S. Cl.
CPC ................ *H01L 21/02381* (2013.01)

(58) Field of Classification Search
CPC ............ H01L 21/0242; H01L 21/02458; H01L 21/0254; H01L 33/007; H01L 21/02647; H01L 21/0265; H01L 21/02639
USPC ............ 438/494; 257/190, E29.085, E21.09
See application file for complete search history.

(56) References Cited

U.S. PATENT DOCUMENTS

| | | | | |
|---|---|---|---|---|
| 8,450,190 | B2 * | 5/2013 | Cheng et al. | 438/478 |
| 2007/0259464 | A1 * | 11/2007 | Bour et al. | 438/22 |

OTHER PUBLICATIONS

Currie, M.T. and Samavedam, S.B. and Langdo, T.A. and Leitz, C.W. and Fitzgerald, E.A., Controlling threading dislocation densities in Ge on Si using graded SiGe layers and chemical-mechanical polishing, Applied Physics Letters, 72, 1718-1720 (1998).*
Choi et al., Low surface roughness and threading dislocation density Ge growth on Si (0 0 1), Journal of Crystal Growth, vol. 310, Issue 18, pp. 4273-4279, 2008.*

* cited by examiner

*Primary Examiner* — Walter H Swanson
(74) *Attorney, Agent, or Firm* — MH2 Technology Law Group, LLP

(57) ABSTRACT

Lattice-mismatched semiconductor devices having a substrate, a first epitaxial film disposed thereon, a dielectric material, and a second epitaxial film. The first epitaxial film contains etch pits that extend from the outer surface of the first epitaxial film into the first epitaxial film. The dielectric material is disposed within the etch pits and blocks at least some of the threading dislocations in the first epitaxial film from propagating into the second epitaxial film. Semiconductor devices containing a silicon (Si) substrate or a silicon germanium (SiGe) substrate, a germanium (Ge) film disposed over the substrate, and a dielectric material. Methods for producing such semiconductor devices.

20 Claims, 7 Drawing Sheets

(a)

SiO$_2$ →
Ge →
Si →

↓ Ideal Case (b)

↓ Actual Case (c)

(a)

SiO₂
Ge
Si (b)

Actual case after removing PR using soft pad

LOW DEFECT DENSITY LATTICE-MISMATCHED SEMICONDUCTOR DEVICES AND METHODS OF FABRICATING SAME

RELATED APPLICATIONS

This application claims priority to U.S. Provisional Patent Application Ser. No. 61/474,005, filed Apr. 11, 2011, which is hereby incorporated by reference in its entirety.

GOVERNMENT RIGHTS

This disclosure was made with Government support under Contract No. DMR-0907112 UNM PDS 33367 awarded by the National Science Foundation. The Government has certain rights in the invention.

BACKGROUND

Increasing operating speeds and computing power of microelectronic devices have led to semiconductor structures having increasing complexity and functionality. Hetero-integration of dissimilar semiconductor materials, for example, III-V materials, such as gallium arsenide, gallium nitride, indium aluminum arsenide, and/or germanium (Ge) with a silicon (Si) or silicon-germanium (SiGe) substrate, is an attractive path for future fabrication. One technique for such integration is often referred to as "heteroepitaxial growth" or "heteroepitaxy," epitaxial growth of a semiconductor material over a semiconductor substrate, for example, by chemical vapor deposition ("CVD") or molecular beam epitaxy ("MBE"), where the semiconductor material, when fully relaxed, has a different lattice constant than the underlying substrate. In particular, heteroepitaxial growth can be advantageously employed to: (i) fabricate semiconductor devices for which lattice-matched substrates are not commercially available, e.g., some types of ultra-high speed radio-frequency (RF) or optoelectronic devices; (ii) combine multiple new materials on a single wafer, e.g., Ge for p-channel field-effect transistor (FET) devices and indium gallium arsenide (InGaAs) or indium antimonide (InSb) for n-channel FET devices; (iii) improve performance of the conventional complementary metal-oxide-semiconductor (CMOS) platform by replacing Si, in active areas of some or all transistors on a wafer, with semiconductor materials with higher mobility and saturation velocity than Si, i.e., Ge and/or III-V materials; and (iv) achieve monolithic integration of semiconductor materials with large mismatch to Si with silicon microelectronics in a manner that is minimally, if at all, disruptive to the CMOS process.

Depending on the application, key considerations for using selective heteroepitaxy for fabrication of semiconductor devices include: control of defect density, surface morphology, and degree of relaxation of the desired portions of heteroepitaxial regions; ease of integration of heteroepitaxy into device manufacturing process; and reliability of electrical isolation of the defective regions from the active regions of the heterostructure.

Performance and, ultimately, the utility of devices fabricated using a combination of dissimilar semiconductor materials depend on the quality of the resulting structure. Specifically, a low level of dislocation defects is important in a wide variety of semiconductor devices and processes, because dislocation defects partition an otherwise monolithic crystal structure and introduce unwanted and abrupt changes in electrical and optical properties, which, in turn, results in poor material quality and limited performance. In addition, dislocation defects can degrade physical properties of the device material and can lead to premature device failure.

As mentioned above, dislocation defects typically arise in efforts to epitaxially grow one kind of crystalline material on a substrate of a different kind of material (often referred to as "heterostructure") due to different crystalline lattice sizes of the two materials. This lattice-mismatch between the starting substrate and subsequent layer(s) creates stress during material deposition that generates dislocation defects in the semiconductor structure. Misfit dislocations form at the mismatched interface to relieve the misfit strain. Many misfit dislocations have vertical components, termed "threading segments," which terminate at the surface. These threading segments continue through all semiconductor layers subsequently added to the heterostructure. In addition, dislocation defects can arise in the epitaxial growth of the same material as the underlying substrate where the substrate itself contains dislocations. Some of the dislocations replicate as threading dislocations in the epitaxially grown material. Such dislocations in the active regions of semiconductor devices such as diodes, lasers and transistors, may significantly degrade performance.

To reduce formation of dislocations and associated performance issues, many semiconductor heterostructure devices known in the art have been limited to semiconductor layers that have very closely (e.g., within 0.1%) lattice-matched crystal structures. In such devices, a thin layer is epitaxially grown on a mildly lattice-mismatched substrate. As long as the thickness of the epitaxial layer is kept below a critical thickness for defect formation, the substrate acts as a template for growth of the epitaxial layer, which elastically conforms to the substrate template. While lattice-matching (or near matching) eliminates dislocations in a number of structures, there are relatively few known lattice-matched systems, limiting the design options for new devices.

Thus, there is a need in the art for versatile and efficient methods of fabricating semiconductor heterostructures that constrain substrate interface defects in a variety of lattice-mismatched materials systems. There is also a need in the art for semiconductor devices utilizing a combination of integrated lattice-mismatched materials with reduced levels of substrate interface defects for improved functionality and performance. There is considerable interest in heterostructure devices involving greater epitaxial layer thickness and greater lattice misfit than known approaches may allow.

For example, high-quality germanium (Ge) grown epitaxially on silicon (Si) continues to be of interest for many notable applications. Specifically, Ge on Si can be used as a substrate for fabrication of multijunction solar cells (e.g., high-efficiency photovoltaics), high-mobility transistors integrated on Si substrates (e.g., strained Si CMOS technology), and near infrared photodetectors, among other devices. However, difficulties exist in achieving high-quality Ge on Si, as there is a 4.2% lattice-mismatch and 116% thermal expansion coefficient (TEC) mismatch between Ge and Si. The lattice-mismatch can result in relatively high threading dislocation densities (TDDs) on the order of $10^8$-$10^9$ cm$^{-2}$ and the TEC mismatch can lead to microcracks in Ge films or their delamination as the Ge film thickness exceeds several micrometers and the material cools from a growth temperature to room temperature. Further, threading dislocations (TDs) in heteroepitaxial films often propagate to the film surface.

Conventional attempts to reduce the defect density in Ge on Si include using graded Ge$_x$Si$_{1-x}$ buffer layers, thermal annealing, selective epitaxial overgrowth (SEG), strained-layer deflection, and aspect ratio trapping (ART). These methods have had varying degrees of success. Disadvantages associated with such methods include the need to use thick buffer layers, high temperature processing, and limited area growth.

The ART technique utilizes high-aspect-ratio holes or trenches etched through dielectric films to trap dislocations, reducing dislocation density. ART techniques can avoid the need for thick buffers and high thermal budgets that are typical of other heteroepitaxial techniques. However, the ART technique may not be effective with holes or strips with dimensions greater than 1 µm.

Thus, there is a need to provide heteroepitaxial films on lattice-mismatched substrates (such as, Ge films on Si substrates, among others) and methods for reducing defects when forming semiconductor layers/devices.

SUMMARY

Certain embodiments are drawn to lattice-mismatched semiconductor devices comprising a substrate, a first epitaxial film disposed over the substrate, a dielectric material and a second epitaxial film disposed over the first epitaxial film and the dielectric material, wherein the substrate and the first epitaxial film are lattice-mismatched. In some embodiments, the first epitaxial layer and the substrate can also be thermal expansion coefficient (TEC) mismatched. The first epitaxial film can comprise at least one crystalline material and a plurality of etch pits, wherein each etch pit extends from an outer surface of the first epitaxial film into the first epitaxial film, and the dielectric material is disposed within each etch pit. The etch pits can intersect threading dislocations (TDs) in the first epitaxial film. The dielectric material can block at least some of the TDs in the first epitaxial film from propagating into the second epitaxial film. In certain embodiments, the second epitaxial film can be an epitaxial lateral overgrowth (ELO) film. In some embodiments, the first epitaxial film and the second epitaxial film can comprise germanium (Ge) and the substrate can comprise silicon (Si) or silicon germanium (SiGe). In certain embodiments, the first epitaxial film and the second epitaxial film can comprise gallium nitride (GaN) or gallium arsenide (GaAs).

Certain aspects are drawn to semiconductor devices comprising a silicon (Si) substrate or a silicon germanium (SiGe) substrate, a first epitaxial film comprising germanium (Ge) disposed over the substrate, a dielectric material; and an epitaxial lateral overgrowth (ELO) film comprising Ge and disposed over the first epitaxial film and the dielectric material disposed in a plurality of etch pits. The first epitaxial film comprises a plurality of etch pits, wherein each etch pit extends from an outer surface of the first epitaxial film into the first epitaxial film, and the dielectric material is disposed within each etch pit. The dielectric material can block at least some of the TDs. In some embodiment, the dielectric material can block at least 50%, at least 75%, or at least 95% of the TDs in the first epitaxial film from propagating into the ELO film. The ELO film (second Ge containing film) grows selectively on the exposed first Ge epitaxial film and laterally over the dielectric material, leading to a coalesced second Ge epitaxial film. In some embodiments, the dielectric material can be $Al_2O_3$, $TiO_2$, $MgO$, $HfO_2$, $SiO_2$, or $Si_3N_4$, among other dielectric materials known in the art. In certain embodiments, the dielectric material can be $SiO_2$ or $Si_3N_4$. In some embodiments, the semiconductor device can further comprise at least one additional film comprising at least one crystalline material disposed over the ELO film. Additional films can be known III-V films, such as, gallium nitride (GaN), gallium arsenide (GaAs), indium gallium phosphide (InGaP), aluminum arsenide (AlAs), and indium aluminum phosphide (InAlP), among others. A GaN film can be applied, if the ELO film is a Ge(111) film, in certain embodiments. In some embodiments, the threading dislocation density (TDD) of the ELO film can be less than about $3.1 \times 10^6$ cm$^{-2}$ and/or the total defect density of the ELO film can be less than about $8.7 \times 10^6$ cm$^{-2}$. In certain embodiments, the twin stacking faults can be less than about $9 \times 10^5$ cm$^{-2}$, the TDD can be less than about $8 \times 10^5$ cm$^{-2}$, and the total defect density can be less than $1.7 \times 10^6$ cm$^{-2}$ in the ELO film.

Certain embodiments are drawn to methods: of forming a semiconductor device comprising a germanium (Ge) film, the method comprising: (a) growing epitaxially a first. Ge film on a silicon (Si) substrate or a silicon germanium (SiGe) substrate, wherein the Ge film comprises an outer surface and a plurality of threading dislocations (TDs); (b) polishing the outer surface, wherein at least some of the threading dislocations (TDs) intersect the polished outer surface; (c) etching the polished outer surface to create etch pits where the TDs intersect the polished outer surface, wherein each etch pit extends from the outer surface of the first Ge film into the first Ge film; (d) coating the etched outer surface by depositing $Al_2O_3$, $TiO_2$, $MgO$, $HfO_2$, $SiO_2$ or $Si_3N_4$ thereon, thereby lining the etch pits with $Al_2O_3$, $TiO_2$, $MgO$, $HfO_2$, $SiO_2$, or $Si_3N_4$, respectively, to produce lined etch pits; (e) coating the deposited $SiO_2$ or $Si_3N_4$ with a polymer, thereby filling the lined etch pits with the polymer; (f) etching the outer surface to the top of the etch pits, thereby planarizing the surface and exposing Ge surrounding the etch pits and $Al_2O_3$, $TiO_2$, $MgO$, $HfO_2$, $SiO_2$, or $Si_3N_4$, $SiO_2$ or $Si_3N_4$ and polymer within the etch pits; (g) removing the polymer in the etch pits following planarization of the outer surface, thereby exposing the lined etch pits; and (h) growing a second Ge film by epitaxial lateral overgrowth (ELO) over the first Ge film, wherein the second Ge film selectively grows on the first Ge film and laterally over the dielectric material (often leaving a void on top of the dielectric-filled etch pits), and eventually coalesces into a continuous film. In embodiments, the etch pits are lined with $SiO_2$ or $Si_3N_4$. Some embodiments can further comprise annealing the first Ge film to the substrate before polishing its outer surface. In some embodiments, the second Ge film can be annealed after the growing step (h). Optionally, steps (b)-(h) can be repeated one or more times after the second Ge film is grown with Ge or one or more crystalline materials to produce additional layered films.

Certain aspects are drawn to methods of forming a lattice-mismatched semiconductor device comprising: (a) growing epitaxially a first film comprising a crystalline material on a substrate, wherein the first film comprises an outer surface and a plurality of threading dislocations (TDs) and the first film and the substrate are lattice-mismatched; (b) polishing the outer surface, wherein at least some of the threading dislocations (TDs) intersect the polished outer surface; (c) etching the polished outer surface to create etch pits where the TDs intersect the polished outer surface, wherein each etch pit extends from the polished outer surface of the first film into the first film; (d) coating the etched outer surface by depositing a dielectric material thereon, thereby lining the etch pits with the dielectric material to produce lined etch pits; (e) coating the deposited dielectric material with a polymer, thereby filling the lined etch pits with the polymer; (f) etching the outer surface to the top of the etch pits, thereby planarizing the surface and exposing crystalline material surrounding the etch pits and the dielectric material and polymer disposed within the etch pits; (g) removing the polymer in the etch pits following planarization of the outer surface, thereby exposing the lined etch pits; and (h) growing a second film comprising at least one crystalline material by epitaxial lateral overgrowth (ELO) over the first film. In some embodiments, the second film selectively grows on the first Ge film and laterally over the dielectric (often leaving a void on top of the dielectric-filled etch pits) and eventually coalesces into a continuous film. Exemplary crystalline materials that can be components of the first film and/or the second film include lattice-mismatched Group IV films (e.g., Ge) and III-V films, such as GaAs, InGaP, AlAs, InAlP, and GaN [if Ge(111) is the underlying film], among others. In some embodiments, the second (ELO film) can be annealed after the growing step (h). Optionally, steps (b)-(h) can be repeated one or more times after the second film is grown with Ge or another crystalline material to produce additional layered films.

BRIEF DESCRIPTION OF THE DRAWINGS

FIG. 2(a) represents an $SiO_2$ layer deposited over a germanium (Ge) film having etch pits. The Ge film is disposed over a Si substrate. FIG. 2(b) represents the ideal (theoretical) result of a chemical-mechanical planarization (CMP) of the $SiO_2$ layer, FIG. 2(c) represents what can be the result of CMP of the $SiO_2$ layer that is not ideal.

FIG. 3(a) represents the ideal (theoretical) result of deposition [i.e., by e-beam deposition, thermal chemical vapor deposition (thermal CVD), plasma-enhanced CVD, or sputter deposition, among others known in the art] of a $SiO_2$ layer over a Ge film having etch pits, coating the lined etch pits and the surface with a photoresist (a polymer), soft pad polishing to remove polymer to the level of the $SiO_2$ layer, dry or wet etching to remove $SiO_2$ not lining the etch pits, and dissolving photoresist remaining in the etch pits. FIG. 3(b) represents what can be a non-ideal result of the steps described for FIG. 3(a) from soft pad polishing through dissolution of photoresist.

DETAILED DESCRIPTION

Figure 1:
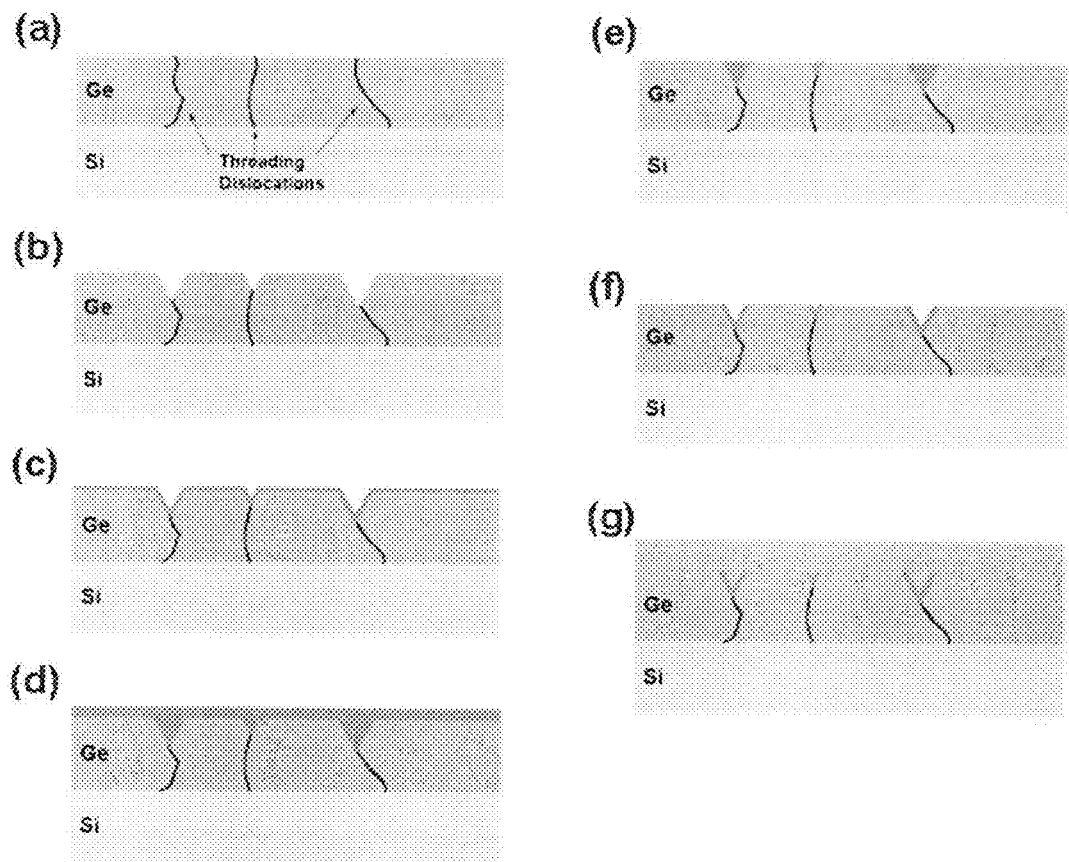
FIG. 1 is a schematic representation of a fabrication process for a Ge on Si semiconductor device and illustrates aspects of certain embodiments.

Silicon (Si) is recognized as presently being the most ubiquitous semiconductor for the electronics industry. Most of the silicon that is used to form silicon wafers is formed from single crystal silicon. Silicon wafers serve as the substrate on which CMOS devices are formed. The silicon wafers are also referred to as a semiconductor substrate or a semiconductor wafer. While described in connection with silicon substrates, however, the use of substrates that include, or consist essentially of, other semiconductor materials, is contemplated without departing from the spirit and scope of the present disclosure.

As mentioned above, in particular applications, the present technology features semiconductor structures of Ge or III-V devices integrated with a Si substrate, such as, for example, gallium arsenide formed on a silicon substrate. Other crystalline semiconductor materials, lattice-mismatched to the underlying substrate, can also be used, such as for example a group, II, a group III, a group IV, a group V, and a group VI element, and combinations thereof, more particularly, germanium, silicon germanium, gallium arsenide, indium phosphide, indium gallium arsenide, indium gallium phosphide, gallium phosphide, gallium nitride, indium gallium nitride, aluminum gallium nitride, indium arsenide, indium antimonide, indium aluminum antimonide, gallium antimonide, and indium gallium antimonide. In some aspects and implementations of this technology, the lattice-mismatched semiconductor material is compositionally graded.

Crystalline materials can include metals, semiconductors, and oxides, wherein a well-defined, long-range order exists with a lattice constant within the material. In some embodiments of this invention, the first layer on the substrate can be any crystalline material lattice-mismatched to the underlying substrate. Two crystalline materials can be categorized as lattice-mismatched, if they do not have the same lattice constant. Often, the lattice-mismatched materials also possess different thermal expansion coefficients (TECs), and they are categorized as TEC-mismatched. In some embodiments, materials are "lattice-mismatched" if the crystal lattice constants of the materials are not within about 1% of each other.

Certain embodiments can be readily introduced into a number of formats to reduce or eliminate one or more dislocations in crystalline films. Some embodiments are drawn to methods by which one can block dislocations in crystalline films epitaxially grown on lattice-mismatched substrates and prevent these dislocations from propagating into subsequently grown films. Certain embodiments can reduce the dislocation density in germanium (Ge) heteroepitaxially grown on a Si substrate by plugging etch pits with a dielectric material and selectively growing Ge over the dielectric surface.

It is known in the art that threading dislocations (TDs) in heteroepitaxial films can propagate to a film's surface. When a chemical etchant is used on a heteroepitaxially grown crystalline film, the film etch rate can be more pronounced where dislocations terminate at the film surface than in surrounding areas, leaving etch pits where the dislocations terminate at the surface. In some embodiments, such etch pits in a first film can contain a dielectric material, such as $Al_2O_3$, $TiO_2$, MgO, $HfO_2$, $SiO_2$, or $Si_3N_4$, among other dielectric materials known in the art. In certain embodiments, such etch pits in a first film can contain a dielectric material, such as $SiO_2$ or $Si_3N_4$, that blocks dislocations from propagating further into subsequently deposited crystalline films.

After the etch pits in the first film are filled with a dielectric material, the surface chemistry can be manipulated to grow a second film, containing the same crystalline material as the first film or to selectively grow a second film containing a different and/or lattice-mismatched crystalline material over the exposed first film surface and the dielectric material disposed within the etch pits. Selective growth can eliminate random nucleation on the dielectric material's surface and can prevent polycrystallinity in the subsequently grown film(s). In some embodiments, conditions for selective growth can include growth at relatively high temperatures well above 400° C. In some instances, growth at temperatures of about 400° C. or below are not selective and polycrystalline films can form above the dielectric material. The transition from non-selective to selective growth can occur at about 550° C.

Certain embodiments are drawn to methods of forming a lattice-mismatched semiconductor device. The methods can comprise: (a) growing epitaxially a first film comprising a crystalline material on a substrate, wherein the first film comprises an outer surface and a plurality of threading dislocations (TDs) and the first film and the substrate are lattice-mismatched; (b) polishing the outer surface, wherein at least some of the threading dislocations (TDs) intersect the polished outer surface; (c) etching the polished outer surface to create etch pits where the TDs intersect the polished outer surface, wherein each etch pit extends from the polished outer surface of the first film into the first film; (d) coating the etched outer surface by depositing a dielectric material thereon, thereby lining the etch pits with the dielectric material to produce lined etch pits; (e) coating the deposited dielectric material with a polymer (e.g., a photoresist), thereby filling the lined etch pits with the polymer; (f) etching the outer surface to the top of the etch pits, thereby planarizing the surface and exposing crystalline material surrounding the etch pits and the dielectric material and polymer disposed within the etch pits; (g) removing the polymer in the etch pits following planarization of the outer surface, thereby exposing the lined etch pits; and (h) growing a second film comprising at least one crystalline material by epitaxial lateral overgrowth (ELO) over the first film. The second film can be grown selectively, such that the second film does not include areas of polycrystallinity. In some embodiments, the second film can be annealed after the growing step (h). Optionally, steps (b)-(h) can be repeated one or more times after the second film is grown with Ge or one or more crystalline materials to produce additional layered films. Polymers (photoresists) used in step (e) can be any known in the art that conformally cover the top surface of the first epitaxial layer with dielectric-filled etch pits. In some embodiments, the polymer can be polymethyl methacrylate (PMMA). In certain embodiments, the coating in step (e) can be done by spin-coating.

In some embodiments, the substrate can be a silicon substrate or a silicon germanium substrate and the first film and the second film can comprise the same crystalline material. In some embodiments, the first film and the second film can be substantially crystal lattice-matched (the lattice constants between crystalline materials of the first and second films are similar, e.g., within 1%). In various embodiments, the substrate can include, or consist essentially of, silicon or a silicon germanium alloy. The crystalline material of the first film (grown epitaxially on the substrate) can include, or consist essentially of, a group II, a group III, a group IV, a group V, and/or a group VI element, and/or combinations thereof, for example, germanium, silicon germanium, gallium arsenide, or gallium nitride, in certain embodiments.

Some embodiments are drawn to methods of forming a lattice-mismatched semiconductor device comprising a germanium (Ge) film, the method comprising: (a) growing epitaxially a first Ge film on a silicon substrate or the silicon germanium substrate, wherein the Ge film comprises an outer surface and a plurality, of threading dislocations (TDs); (b) polishing the outer surface, wherein at least some of the threading dislocations (TDs) intersect the polished outer surface; (c) etching the polished outer surface to create etch pits where the TDs intersect the polished outer surface; (d) coating the etched outer surface by depositing $Al_2O_3$, $TiO_2$, MgO, $HfO_2$, $SiO_2$, or $Si_3N_4$, thereby lining the etch pits with $Al_2O_3$, $TiO_2$, MgO, $HfO_2$, $SiO_2$, or $Si_3N_4$, respectively; (e) coating the deposited $Al_2O_3$, $TiO_2$, MgO, $HfO_2$, $SiO_2$, or $Si_3N_4$ with a polymer, thereby filling the lined etch pits with the polymer; (f) etching the outer surface to the top of the etch pits, thereby planarizing the surface and exposing Ge surrounding the etch pits and $Al_2O_3$, $TiO_2$, MgO, $HfO_2$, $SiO_2$, or $Si_3N_4$ and polymer within the etch pits; (g) removing the polymer in the etch pits following planarization of the outer surface, thereby exposing the lined etch pits; and (h) growing a second Ge film by epitaxial lateral overgrowth (ELO) over the first Ge film. The second Ge film can be grown selectively such that the second Ge film does not contain areas of polycrystallinity. In embodiments, the etch pits are lined with $SiO_2$ or $Si_3N_4$. In some embodiments, the second Ge film can be annealed after the growing step (h). Optionally, steps (b)-(h) can be repeated one or more times after the second Ge film is grown with Ge or one or more crystalline materials to produce additional layered films.

In some embodiments, the polymer (e.g., photoresist) used to coat the deposited $Al_2O_3$, $TiO_2$, MgO, $HfO_2$, $SiO_2$, or $Si_3N_4$ can be a suitable polymer known in the art, such as poly(methyl methacrylate) (PMMA), among others. Etchants that can be used to reveal etch pits include KOH:HF 1:1 by volume; CP4 etchant ($HNO_3$:HF:Acetic Acid 2:1:10 by volume); and $K_2Cr_2O_7$:HF 1:1 by volume, among others.

In certain aspects, the methods can further comprise cleaning, chemically oxidizing and removing $SiO_2$ from the silicon substrate before growing the first Ge film on the silicon substrate. In some embodiments, the growth rate of the first film can be between about 0.1 nm/s and about 0.3 nm/s, or be about 0.14 nm/s. The first film can be annealed before polishing of the outer surface of the first film. The annealing temperature can range from about 750° C. to about 900° C. The annealing temperature in embodiments is below about 938° C. (the melting point of Ge). Annealing can be performed from about 20 minutes to about 40 minutes. The first Ge film can be polished using chemical mechanical planarization steps known in the art. For example, the polishing can be carried out as described in co-pending U.S. patent application Ser. No. 12/613,161 to Han et al. "Slurry-Free Chemical Mechanical Planarization (CMP) of Engineered Germanium-On-Silicon Wafers," filed Nov. 5, 2009, the disclosure of which is hereby incorporated herein in its entirety. In some embodiments, the first film can be a Ge film, the substrate can be a Si substrate or a SiGe substrate, and the first Ge film can be annealed at a temperature of about 850° C. (1123° K) for about 30 minutes.

In some embodiments, the polished outer surface of the first film can be etched with an etchant having 2 volumes 49% HF and 1 volume 0.1 M $K_2Cr_2O_7$ to create etch pits where the TDs intersect the polished outer surface. Other etchant solutions can include a mixture of 50 mL of 49 wt % HF, 100 mL of 70 wt % $HNO_3$, and 110 mL of 99.3 wt % glacial acetic acid. Other etchants typically used for etch pit density measurements known in the art are equally applicable. The duration of etching typically ranges from about 1 minute to about 2 minutes, depending on the threading dislocation density (TDD). If the TDD is high (e.g., greater than about $10^7$ cm$^{-2}$), the etch time can be reduced to avoid overlapping etch pits.

In certain embodiments, the dielectric material (e.g., $SiO_2$ or $Si_3N_4$, among others) can be coated on the etched outer surface by plasma-enhanced chemical vapor deposition or e-beam deposition, thereby lining etch pits with dielectric material. In some aspects, the dielectric material can be $SiO_2$ that is deposited using plasma-enhanced chemical vapor deposition.

Deposited dielectric material (such as, $SiO_2$ or $Si_3N_4$) can be coated with a polymer (e.g., a photoresist) by spin-coating the polymer on the dielectric material coated outer surface, in some embodiments. In certain embodiments, a photoresist that is spin coated over the dielectric material can have a thickness of about 50 nm. Spin-coating can be used to provide uniformity in polymer film thickness, processability, and ease of film thickness control. Other polymers (e.g., photoresists) such as Shipley i300 and AZ® 5214 can be used in some embodiments. Depending on the rotating speed of a spin coater and photoresist thinner content, a resulting film thickness can be in the range of from about 10 nm to about 1.4 μm.

In certain aspects, following deposition of the dielectric material and photoresist, the outer surface can be etched to the top of the etch pit. The outer layer can be etched with a reactive ion etcher, in certain embodiments. In some embodiments, the reactive ion etching can be performed with $CHF_3$ and $O_2$. In embodiments, the outer surface can be etched to the top of the etch pit using an inductive plasma source or a capacitive plasma source. For example, a high-density plasma etching recipe using different fluorocarbon precursors (e.g., $C_2F_6$) can be used, in some embodiments. Following planarization, the polymer remaining in the etch pits can be removed from the etch pits with $O_2$ plasma, in certain aspects. In addition to the dry etching technique, the polymer can be dissolved in an organic solution, such as methanol, acetone, ethyl lactate, and 2-methoxy-1-methylethylacetate, among others known in the art.

In certain embodiments, the second film can be grown under conditions such that Ge growth is selective, and random nucleation of Ge does not take place on the $SiO_2$ deposited in the etch pits of the first film. In certain embodiments, such conditions can involve growing the second Ge film at a high temperature in the range of about 550 to 620° C., which provides good selectivity without sacrificing the growth rate. The conditions can be such that nucleation of Ge does not take place on the $SiO_2$, because of the small desorption activation barrier of Ge on $SiO_2$. The second film can be grown at a temperature of about 923 K, in certain embodiments. Thus, the conditions can be controlled to prevent the second film from containing polycrystalline portions. In some embodiments, the second film can be grown up to a thickness of about 2 μm. The total film thickness combining both the first Ge layer and the second Ge layer can be up to 4 μm, without forming microcracks in the epilayer due to TEC mismatch. The outer surface of the second Ge film can be polished, in certain embodiments.

Certain embodiments can be better understood by reference to FIG. 1, which is a schematic representation of a fabrication process for a semiconductor device comprising germanium (Ge) on a silicon (Si) substrate. FIG. 1 schematically shows a process flow to reduce the dislocation density in Ge heteroepitaxially grown on Si by plugging etch pits with a dielectric material ($SiO_2$) and selectively growing Ge over the dielectric material.

FIG. 1(a) represents a first Ge film deposited on a Si substrate with threading dislocations (TDs) that terminate at the surface of the first Ge film. Etch pits formed in the outer surface of the first Ge film where the dislocations terminate are depicted in FIG. 1(b). FIG. 1(c) illustrates a thin layer of $SiO_2$ that can be deposited over the entire outer surface of the Ge film having the etch pits, and FIG. 1(d) shows a thin layer of polymer (photoresist) coated over the thin layer of $SiO_2$. The polymer can be poly(methyl methacrylate) (PMMA) in some embodiments, and in certain aspects PMMA can be spin-coated over the surface of the thin layer of $SiO_2$. Etching (e.g., reactive ion etching) can be employed to remove $SiO_2$ and polymer from the planar surface of the first Ge film, such that $SiO_2$ and the polymer remain in the etch pits, as shown in FIG. 1(e). FIG. 1(f) depicts the surface of the first Ge film after the residual polymer in the etch pits is removed. FIG. 1(g) shows the semiconductor device following the growth of a selective epitaxial lateral overgrowth (ELO) film of Ge where the $SiO_2$ lined etch pits in the first Ge film block at least some threading dislocations in the first Ge film from propagating into the second (ELO) Ge film.

Some embodiments can be better understood by reference to FIGS. 2(a), 2(b), 3(a) and 3(b), which is a schematic representation of portions of a fabrication process for a semiconductor device comprising germanium (Ge) on a silicon substrate.

Figure 2:
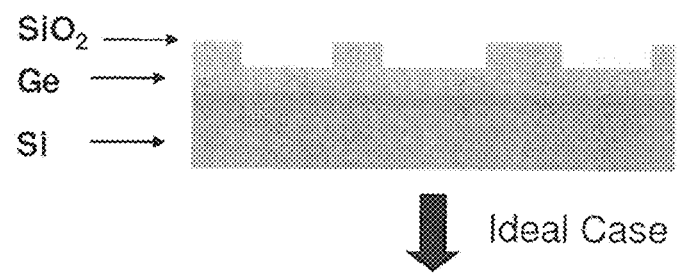
FIGS. 2(a), 2(b), and 2(c) are schematic representations of steps in fabricating a Ge on Si semiconductor device and illustrate aspects of certain embodiments.
Figure 2:
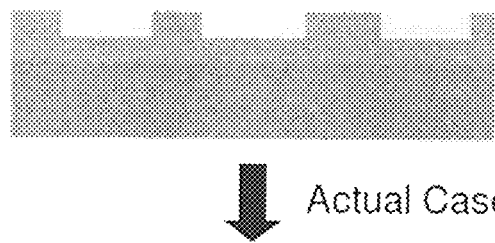
Figure 2:
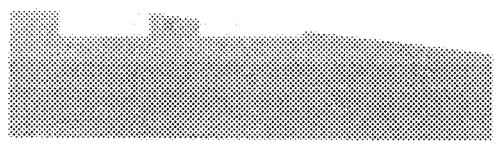
Figure 3:
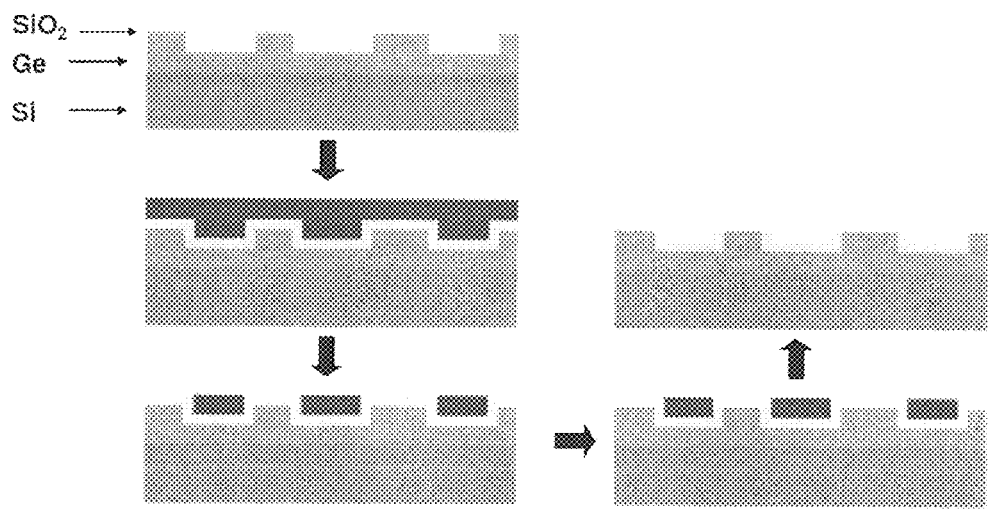
FIGS. 3(a) and 3(b) are schematic representations of steps in fabricating a Ge on Si semiconductor device and illustrate aspects of certain embodiments.
Figure 3:
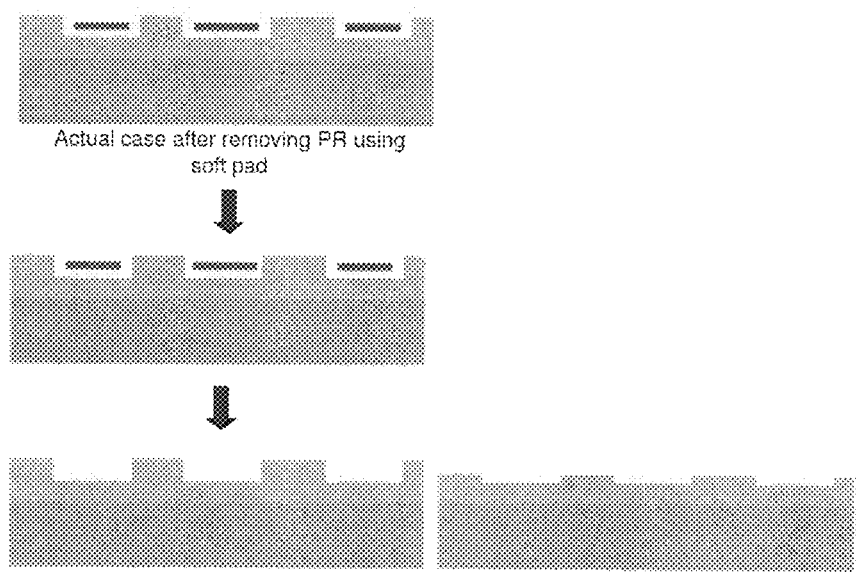

FIGS. 2 and 3 illustrate results of embodiments and some non-ideal results that can occur in actual processing steps that are not performed as in embodiments. FIG. 2(c) illustrates what can happen if a polishing pad is not perfectly parallel to a substrate surface. That is, it is important to keep the polishing pad as parallel as possible to the substrate surface in embodiments. FIG. 3(b) illustrates over-etching (or over-ashing) a photoresist and exposing the edge of etch pits during an oxide etch, thus leading to loss of $SiO_2$ around the edge of etch pits. In some cases, this can lead to complete loss of $SiO_2$ and threading dislocations can continue to propagate through a second Ge layer, which embodiments seek to avoid.

As discussed above, FIGS. 2(a) and 2(b) are schematic representations of steps in fabricating a semiconductor device and illustrate aspects of certain embodiments. Certain embodiments are drawn to methods comprising depositing a first Ge film on a Si substrate and resulting in threading dislocations (TDs) that terminate at the surface of the first Ge film. Etch pits are formed in the outer surface of the first Ge film where the dislocations terminate. FIG. 2(a) illustrates a thin layer of $SiO_2$ deposited over the entire outer surface of the Ge film having the etch pits, and FIG. 2(b) represents the result of a chemical-mechanical planarization (CMP) of a $SiO_2$ layer deposited over a germanium (Ge) film having etch pits intersecting threading dislocations (TDs) as in certain embodiments. FIG. 2(c) represents what can be a non-ideal actual result of CMP of the $SiO_2$ layer, if not performed as in some embodiments. Following chemical-mechanical planarization, a selective epitaxial lateral overgrowth (ELO) film of Ge can be grown over the first Ge film. The $SiO_2$ lined etch pits in the first Ge film can block threading dislocations in the first Ge film from propagating into the second (ELO) Ge film, in some embodiments.

FIGS. 3(a) and 3(b) are schematic representations of steps in fabricating a semiconductor device and illustrate aspects of certain embodiments. Certain embodiments are drawn to methods comprising depositing a first Ge film on a Si substrate, the first Ge film having threading dislocations (TDs) that terminate at its surface. Etch pits are formed in the outer surface of the first Ge film where the dislocations terminate. Beginning at the top left of FIG. 3(a), a thin layer of $SiO_2$ can be deposited [i.e., by e-beam deposition, thermal chemical vapor deposition (thermal CVD), plasma-enhanced CVD, or sputter deposition, among others known in the art] over the entire outer surface of the Ge film having exposed etch pits and a photoresist can be applied over the $SiO_2$ layer [middle left of FIG. 3(a)]. The surface of the device can be polished with a soft pad to remove polymer to the level of the $SiO_2$ layer [bottom left of FIG. 3(a)]. Wet etching can be used to remove SiO$_2$ not lining the etch pits [bottom right of FIG. 3(a)], and the photoresist remaining in the etch pits can be dissolved [top right of FIG. 3(a)]. FIG. 3(b) represents what can be the non-ideal result of the steps described in FIG. 3(a) from soft pad polishing through dissolution of photoresist, if steps of certain embodiments are not carried out properly. Following soft pad polishing, a selective epitaxial lateral overgrowth (ELO) film of Ge can be grown over the first Ge film. The SiO$_2$ lined etch pits in the first Ge film can block threading dislocations in the first Ge film from propagating into the second (ELO) Ge film, in some embodiments.

Certain embodiments are drawn to lattice-mismatched semiconductor devices comprising: a substrate; a first epitaxial layer comprising at least one crystalline material disposed over the substrate, wherein the first epitaxial layer and the substrate are lattice-mismatched; a dielectric material disposed within a plurality of etch pits; and a second epitaxial film comprising at least one crystalline material disposed over the first epitaxial film and the dielectric material disposed within each etch pit. The first epitaxial film comprises the plurality of etch pits, wherein each etch pit extends from an outer surface of the first epitaxial film into the first epitaxial film. The dielectric material can block at least some of the TDs in the first epitaxial film from propagating into the second epitaxial film. In some embodiments, the second epitaxial film can be an epitaxial lateral overgrowth (ELO) film.

In some embodiments, the first epitaxial film and the second epitaxial film comprise germanium (Ge) and the substrate comprises silicon (Si) or silicon germanium (SiGe). The first epitaxial film and/or the second epitaxial film can comprise gallium nitride (GaN) or gallium arsenide (GaAs) in some aspects. In certain embodiments, the crystalline materials in the first epitaxial film and the second epitaxial film can be different and/or lattice-mismatched. In other embodiments, the crystalline materials in the first epitaxial film and the second epitaxial film can be the same. In some embodiments, the first epitaxial film and the second epitaxial film can be substantially lattice-matched (the lattice constants between crystalline materials of the first epitaxial film and the second epitaxial film are similar, e.g., within 1%). The semiconductor device can further comprise at least one additional film comprising at least one crystalline material overlaying the second epitaxial film, in certain embodiments. At least one additional film can be a known III-V film, such as, gallium nitride (GaN), gallium arsenide (GaAs), indium gallium phosphide (InGaP), aluminum arsenide (AlAs), or indium aluminum phosphide (InAlP), among others. A GaN film can be applied, if the ELO film is a Ge(111) film, in certain embodiments.

Certain embodiments are drawn to semiconductor devices comprising: a silicon (Si) substrate or a silicon germanium (SiGe) substrate; a first epitaxial film disposed over the substrate, the first epitaxial film comprising germanium (Ge) and a plurality of etch pits; a dielectric material disposed within each etch pit; and an epitaxial lateral overgrowth (ELO) film disposed over the first epitaxial film and the dielectric material within the plurality of etch pits, wherein the ELO film comprises Ge. Each etch pit extends from an outer surface of the first epitaxial film into the first epitaxial film. The dielectric material blocks at least some of the TDs in the first epitaxial film from propagating into the ELO film. The ELO film can be grown selectively to avoid random nucleation at the exposed dielectric material.

In some embodiments, selective growth of Ge over the dielectric material that lines an etch pit is facilitated by small desorption activation barrier ($E_{des}$) and small diffusion activation barrier ($E_{diff}$) of Ge adspecies (e.g., Ge adatoms, addimers, and adtrimers on SiO$_2$). In certain embodiments, a semiconductor device can have a threading dislocation density (TDD) of the ELO/second epitaxial film of less than about $2.7 \times 10^7$ cm$^{-2}$, about $1 \times 10^7$ cm$^{-2}$ or less, about $5 \times 10^6$ cm$^{-2}$ or less, about $3.1 \times 10^6$ cm$^{-2}$ or less, about $1 \times 10^6$ cm$^{-2}$ or less, or about $8 \times 10^5$ cm$^{-2}$ or less. In some embodiments, a semiconductor device can have a total defect density of the ELO/second epitaxial film of less than about $1 \times 10^7$ cm$^{-2}$, about $8.7 \times 10^6$ cm$^{-2}$ or less, about $5 \times 10^6$ cm$^{-2}$ or less, about $3.1 \times 10^6$ cm$^{-2}$ or less, or about $1.7 \times 10^6$ cm$^{-2}$ or less.

In some embodiments, the first epitaxial film of a semiconductor device can be annealed to improve the crystallinity. The annealing temperature can range from about 750° C. to about 900° C., or below the melting point of Ge at 938° C. The duration of annealing can range from about 20 minutes to about 40 minutes. The first epitaxial film can have a thickness of about 10 nm to about 2 µm, 100 nm to about 2 µm, or about 1 µm. A minimum of about 10 nm thickness is required to ensure full coalescence of the epitaxial film (e.g., Ge film) to be a continuous film, and the maximum thickness is limited by the TEC mismatch. The substrate can be a silicon substrate doped (with boron, for example) to have a resistivity of between about 0.05 Ω·cm to 3000 Ω·cm or between about 1 Ω·cm to about 10 Ω·cm at about 20° C. Low-resistivity substrates (i.e., heavily doped Si substrates) can result in better Ge epilayer quality and lower threading dislocations than high-resistivity, semi-insulating Si substrates. Exemplary dielectric materials that can be used in certain embodiments include Al$_2$O$_3$, TiO$_2$, MgO, HfO$_2$, SiO$_2$, or Si$_3$N$_4$, among others known in the art. In certain embodiments, the dielectric material can be SiO$_2$ or Si$_3$N$_4$. In some embodiments, the dielectric material disposed within/lining etch pits can have a thickness of about 15 nm to about 50 nm, or about 15 nm. Etch pits in a first epitaxial film of a semiconductor device can be at least about 60 nm deep or from about 30 nm to about 100 nm deep, in some embodiments. In certain embodiments, etch pits in a first epitaxial film of a semiconductor device can be on average about 100 nm deep and about 500 nm in diameter. In some embodiments, etch pits can have an average diameter from about 300 nm to about 1 micron in diameter.

In some embodiments, a semiconductor device can further comprise at least one additional film comprising at least one crystalline material disposed over a second film (such as an ELO Ge film). The additional film can comprise Ge, or a different and/or lattice-mismatched, or same and/or substantially lattice-matched crystalline material. The additional film can be a known III-V film, such as, gallium nitride (GaN), gallium arsenide (GaAs), indium gallium phosphide (InGaP), aluminum arsenide (AlAs), or indium aluminum phosphide (InAlP), among others. A GaN film can be applied, if the ELO film is a Ge(111) film, in certain embodiments.

The following Examples further define and describe embodiments herein. Unless otherwise indicated, all parts and percentages are by weight.

EXAMPLES

Example 1

Fabrication of a Ge on Si Device

A Si(100) substrate was cleaned and chemically oxidized for 5 min in a piranha etch bath containing about 3 volumetric parts of H$_2$SO$_4$ (96 wt %) and about 1 part H$_2$O$_2$ (30 wt %). The sample was then annealed in a vacuum at about 850° C. for about 30 minutes to remove the chemical SiO$_2$ from the silicon substrate.

Ge was deposited using molecular beam epitaxy (MBE) to a thickness of about 1 micron. The sample was then annealed, after growth, at about 850° C. for about 30 minutes. This process resulted in a threading dislocation density (TDD) in the Ge film of approximately $5 \times 10^7$ cm$^{-2}$. In a subsequent fabrication of a Ge on Si device according to an embodiment where the first Ge layer was annealed at 800° C. for 30 minutes, a TDD in the Ge of about $2.7 \times 10^7$ cm$^{-2}$ was provided. (See Leonhardt and Han, "Dislocation reduction in heteroepitaxial Ge on Si using SiO2 lined etch pits and epitaxial lateral overgrowth," Applied Physics Letters, 2011, Vol. 99, pages 111911-1 through 111911-3, the entire contents of which are incorporated herein by reference.) Next, the sample was removed from the MBE and polished using a solution containing about 50 volumetric parts de-ionized water and 1 volumetric part 30 wt % $H_2O_2$. Thus, FIG. 1 (a) schematically represents a polished Ge on Si device, as fabricated in the Example.

The sample was etched in a solution of 1 volumetric part 0.1 M $K_2Cr_2O_7$ and 2 volumetric parts 49 wt % HF, for a total of about 5 minutes. This produced etch pits in the Ge film surface corresponding to the locations where threading dislocations terminate at the surface of the Ge film. The etch pits were approximately 100 nm deep and 500 nm in diameter, on average. Such etch pits are represented by FIG. 1(b).

SiO$_2$ was deposited onto the etched Ge surface using plasma-enhanced chemical vapor deposition at a thickness of about 15 nm. FIG. 1 (c) is a representation of an aspect of this deposition step. A polymer (PMMA) was then spin-coated onto the sample and filled the etch pits and planarized the surface. [See a schematic in FIG. 1(d).]

The sample was etched in a reactive ion etcher to uniformly remove the polymer and SiO$_2$ from all areas of the Ge surface except within the etch pits [FIG. 1 (e)]. O$_2$ plasma was used to remove the remaining polymer within the etch pits [FIG. 1 (f)].

Ge was selectively grown over the SiO$_2$ covered etch pits until a fully coalesced Ge film was obtained. The second Ge layer was then polished to produce an atomically flat surface, as represented by FIG. 1 (g), with TDs blocked from propagating into the newly grown Ge film by the SiO$_2$ coated etch pits.

Example 2

Production and Lining of Etch Pits

Figure 4:
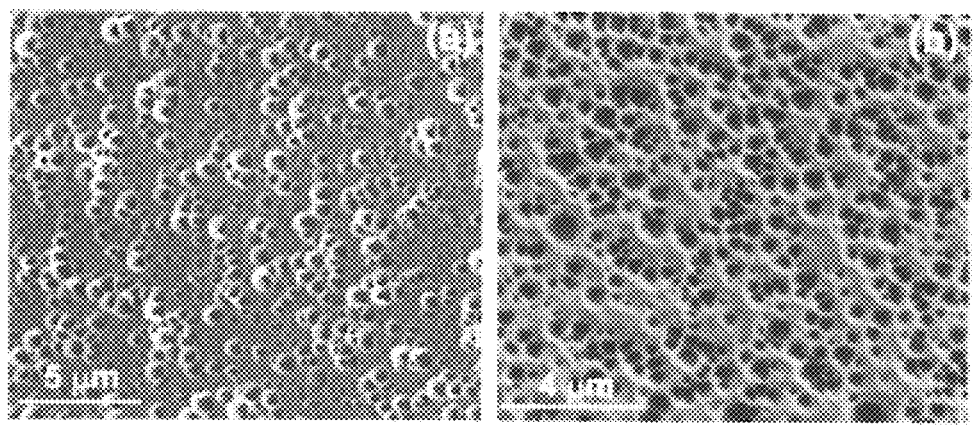
FIGS. 4(a) and 4(b) are scanning electron microscope (SEM) images of etch pits and $SiO_2$ lined etch pits in a first Ge film grown using molecular beam epitaxy (MBE) on a Si substrate.

A Si substrate that was a 2 inch wafer doped with boron to a resistivity of 1 Ω·cm to 10 Ω·cm at 20° C. was cleaned for 5 minutes in a piranha bath (mixture of 96-98% $H_2SO_4$ and 30-35% $H_2O_2$ in a volume ratio of 2-4:1) heated to 100° C. The sample was subsequently dipped in a buffered oxide etch solution (6:1 volume ratio of 40% NH$_4$F in water to 49% HF in water) to remove the chemical oxide. The sample was degassed at 873 K for 10 minutes after being loaded into a deposition chamber. The MBE Ge growth rate was 0.14 nm/s, and deposition was carried out until a film thickness of 1.0 μm was reached. The sample was planarized following Ge deposition. The Ge-on-Si wafers were polished, using a Logitech PM5 lapping/polishing machine on a Logitech Chemcloth polishing pad. The polished sample had threading dislocations that intersected with the polished Ge film's surface. Etch pits were created in the Ge using a solution of 2 volumetric parts 49% HF and 1 volumetric part 0.1 M $K_2Cr_2O_7$, as shown in FIG. 4(a). FIG. 4(a) is a scanning electron microscope (SEM) image of the etch pits produced. The thickness of the Ge film surrounding the etch pits was approximately 500 nm, and the etch pit density (EPD) was $2.6 \times 10^8$ cm$^{-2}$. The etch pits ranged from 300 nm to 1 μm in diameter and ranged from 30 to 100 nm in depth.

Following creation of the etch pits, the sample was coated with 15 nm of SiO$_2$, which was deposited in a plasma-enhanced chemical vapor deposition chamber using SiH$_4$ and N$_2$O. A 50 nm thick film of poly(methyl methacrylate) (PMMA) was spin-coated onto the sample following SiO$_2$ deposition. The PMMA flowed into the etch pits and planarized the sample surface. The PMMA and SiO$_2$ were etched to the top of the etch pits, using reactive ion etching with CHF$_3$ and O$_2$, and the Ge surrounding the etch pits was thereby exposed. Residual PMMA was removed from within the etch pits using an O$_2$ plasma, and the resulting surface is depicted in FIG. 4(b). FIG. 4(b) is an SEM image of SiO$_2$ lined etch pits in a first Ge film grown using molecular beam epitaxy (MBE) on a Si substrate. In FIG. 4(b), the SiO$_2$ lined pits show up darker than the surrounding planar regions of the Ge surface.

Example 3

Growth of Epitaxial Lateral Overgrowth (ELO) Ge Film

Figure 5:
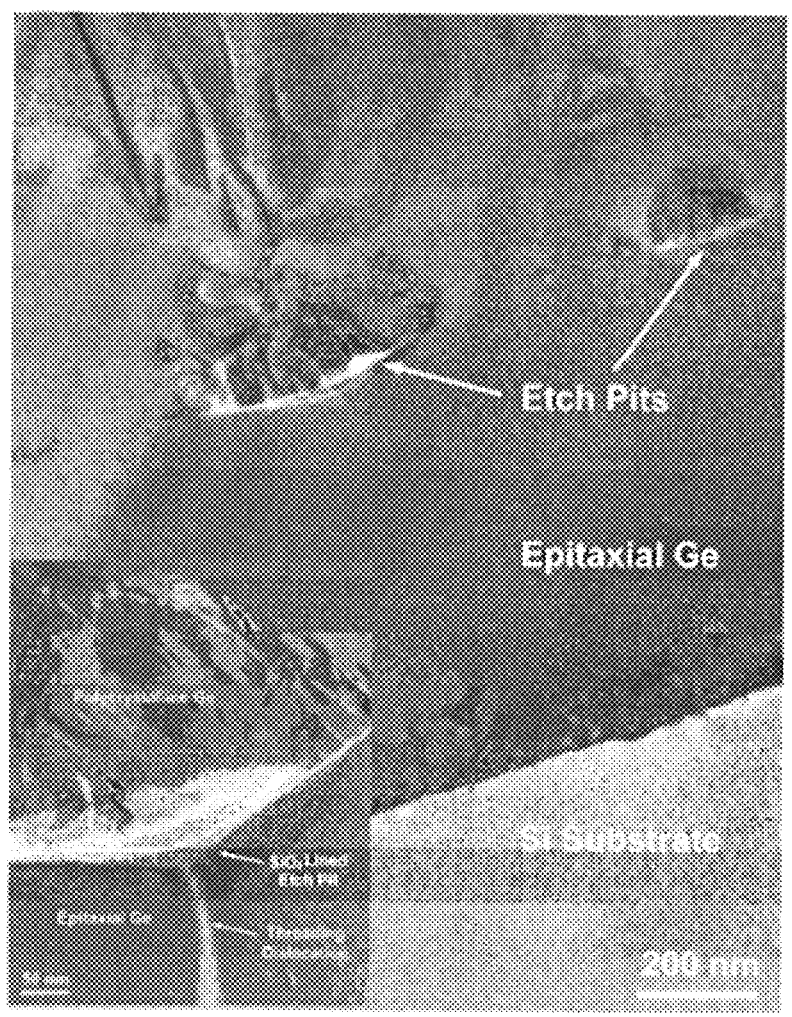
FIG. 5 contains cross-sectional transmission electron microscope (x-TEM) images of $SiO_2$ lined etch pits in a first Ge film grown using MBE on a Si substrate wherein a second [epitaxial lateral overgrowth (ELO)] Ge film displays polycrystallinity.
Figure 6:
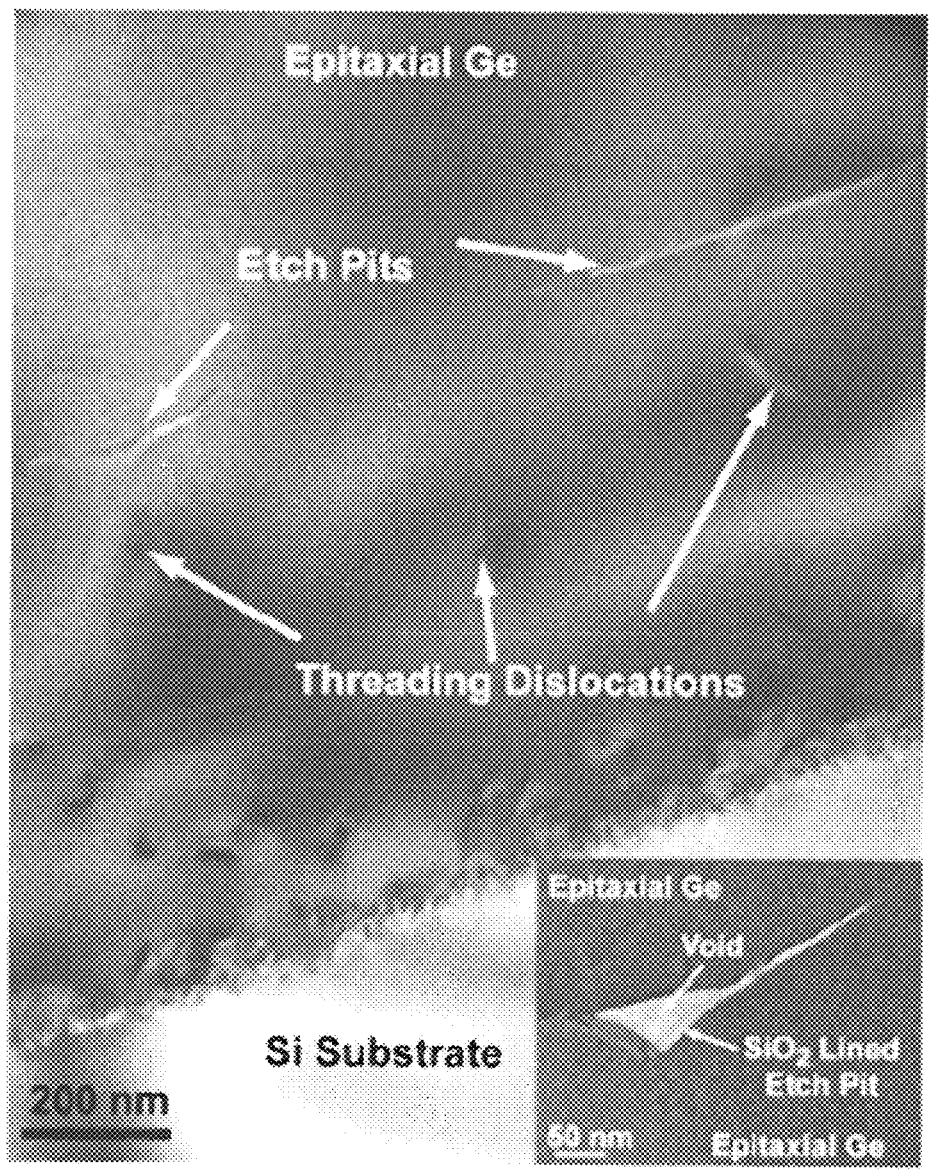
FIG. 6 contains cross-sectional transmission electron microscope (x-TEM) images of $SiO_2$ lined etch pits in a first Ge film grown using MBE on a Si substrate blocking threading dislocations (TDs) from propagating into a second [epitaxial lateral overgrowth (ELO)] Ge film grown selectively. Polycrystallinity is not observed in the ELO Ge film.

A sample prepared as in Example 2 having SiO$_2$ lined etch pits was reintroduced into a MBE chamber where an additional 2 μm of Ge was deposited, followed by polishing. FIGS. 5 and 6 show that the SiO$_2$ blocked threading dislocations from propagating into the ELO Ge film.

FIG. 5 shows a cross-sectional transmission electron microscope (x-TEM) image of a Ge ELO film over SiO$_2$ lined etch pits. The deposition of the Ge ELO film was carried out at a substrate temperature of 673 K, such that Ge growth was random, and Ge nucleation took place on the SiO$_2$. The TEM image shows that polycrystalline Ge existed above the SiO$_2$, indicating that the Ge ELO growth was random at the substrate temperature of 673 K. Further, additional defects were created in the Ge ELO film by the presence of the polycrystalline Ge.

FIG. 6 shows a cross-sectional transmission electron microscope (x-TEM) image of a Ge ELO film over SiO$_2$ lined etch pits. The deposition of the Ge ELO film was carried out at a substrate temperature of 923 K, such that Ge growth was selective, and random Ge nucleation did not take place on the SiO$_2$ due to the small desorption activation energy of Ge on SiO$_2$. The TEM image shows that no polycrystalline Ge existed above the SiO$_2$, indicating that the Ge ELO growth was highly selective at the elevated substrate temperature. As seen in the TEM image, threading dislocations present in the initial Ge film grown on the Si substrate terminated at the SiO$_2$ lined etch pits and did not propagate into the Ge ELO film. The inset in FIG. 6 reveals a void between the Ge and the SiO$_2$ layer that was formed upon Ge coalescence over the etch pit.

Example 4

Annealing of Initial Ge Film to Si Substrate

Figure 7:
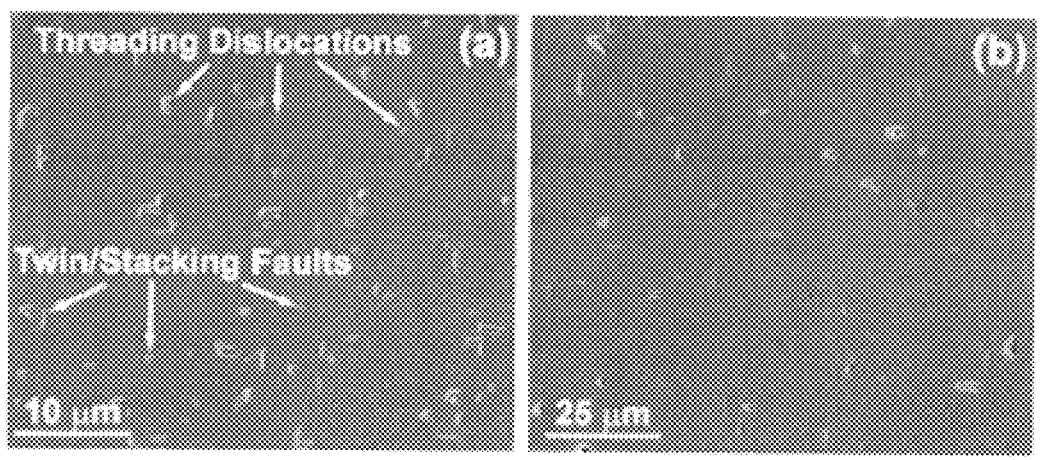
FIGS. 7(a) and 7(b) are SEM images showing etch pit density (EPD) in a second (ELO) Ge film selectively grown over $SiO_2$ lined etch pits (a) without and (b) with annealing of the first Ge film grown using MBE on a Si substrate.

FIGS. 7(a) and 7(b) are SEM images showing etch pit density (EPD) in a second (ELO) Ge film selectively grown over SiO$_2$ lined etch pits (a) without and (b) with annealing of a first Ge film (grown using MBE) on a Si substrate. The films shown in FIG. 7 were prepared as described in Examples 2 and 3 above, without or with an annealing step, wherein the first Ge film was annealed to the Si substrate at 1073 K for 30 minutes before growth of the Ge ELO film over the first Ge film.

The Ge ELO film that was grown on a first Ge film without annealing had twin/stacking fault defects [rectilinear pits in FIG. 7(a)] and threading dislocations [square pits in FIG. 7(a)]. The density was $5.6 \times 10^6$ cm$^{-2}$ for twins/stacking faults and $3.1 \times 10^6$ cm$^{-2}$ for threading dislocations with a total defect density of $8.7 \times 10^6$ cm$^{-2}$ in the Ge ELO film. The reduction factor in defect density was 31 for the Ge ELO film compared to the first Ge film.

The density of twins/stacking faults and threading dislocations of the Ge ELO film grown on an annealed first Ge film were 9 and $8 \times 10^5$ cm$^{-2}$, respectively. [See FIG. 7(b) showing the etch pit density (EPD) of a Ge ELO film grown on an annealed first Ge film.] The total defect density of $1.7 \times 10^6$ cm$^{-2}$ in the Ge ELO film grown on the annealed first Ge film may allow for minority carrier lifetimes in III-V films integrated on these Ge/Si substrates to be comparable to that in III-V films grown on Ge and GaAs substrates.

The results demonstrated that defect density was further reduced in the Ge ELO film by annealing the first Ge film after its deposition on the Si substrate. The threading dislocation density was reduced in the first Ge film from an initial value of $2.6 \times 10^8$ cm$^{-2}$ to $2.7 \times 10^7$ cm$^{-2}$. The etch pits subsequently created in the annealed first Ge film were more uniform in size and more clearly delineated from each other compared to a sample prepared without annealing.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature can be combined with one or more other features of the other implementations as can be desired and advantageous for any given or particular function.

Furthermore, to the extent that the terms "containing," "including," "includes," "having," "has," "with," or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g., −1, −1.2, −1.89, −2, −2.5, −3, −10, −20, and −30, etc. Other embodiments of the present teachings will be apparent to those skilled in the art from consideration of the specification and practice of the present teachings disclosed herein. It is intended that the specification and examples be considered as exemplary only, with a true scope and spirit of the present teachings being indicated by the following claims.

What is claimed is:

1. A method of forming a semiconductor device comprising a germanium (Ge) film, the method comprising:
   growing epitaxially a first Ge film directly on a silicon (Si) substrate or a silicon germanium (SiGe) substrate, wherein the Ge film comprises an outer surface and a plurality of threading dislocations (TDs);
   annealing the first Ge film to the substrate at an annealing temperature in a range of from about 750° C. to about 900° C. before polishing the outer surface of the first Ge film and before growing a second Ge film over the first Ge film;
   after annealing the first Ge film to the substrate and before etching the outer surface of the first Ge film, polishing the outer surface of the first Ge film, wherein at least some of the threading dislocations (TDs) intersect the polished outer surface;
   after polishing the outer surface, etching the polished outer surface to create etch pits where the TDs intersect the polished outer surface, wherein each etch pit extends from the outer surface of the first Ge film into the first Ge film;
   coating the etched outer surface by depositing $Al_2O_3$, $TiO_2$, MgO, $HfO_2$, $SiO_2$, or $Si_3N_4$ thereon, thereby lining the etch pits with $Al_2O_3$, $TiO_2$, MgO, $HfO_2$, $SiO_2$, or $Si_3N_4$, respectively, to produce lined etch pits;
   coating the deposited $Al_2O_3$, $TiO_2$, MgO, $HfO_2$, $SiO_2$, or $Si_3N_4$ with a polymer, thereby filling the lined etch pits with the polymer;
   etching the coated outer surface until a top portion of the etch pits is reached, thereby planarizing the outer surface and exposing the first Ge film surrounding the etch pits and the $Al_2O_3$, $TiO_2$, MgO, $HfO_2$, $SiO_2$, or $Si_3N_4$ and the polymer disposed within the etch pits;
   removing the polymer in the etch pits following planarization of the outer surface, thereby exposing the lined etch pits; and
   after removing the polymer in the etch pits, growing the second Ge film by epitaxial lateral overgrowth (ELO) directly on the annealed first Ge film.

2. The method of claim 1, further comprising annealing the second Ge film.

3. The method of claim 1, wherein a threading dislocation density (TDD) of the second Ge film grown by ELO is between about $8 \times 10^5$ cm$^{-2}$ to about $2.7 \times 10^7$ cm$^{-2}$.

4. The method of claim 1, wherein the total defect density of the second Ge film grown by ELO is between about $8 \times 10^5$ cm$^{-2}$ to about $1 \times 10^7$ cm$^{-2}$.

5. The method of claim 1, further comprising growing at least one additional film comprising at least one crystalline material over the second Ge film.

6. The method of claim 1, wherein the first Ge film has a thickness of about 1 μm.

7. The method of claim 1, wherein the etch pits are at least about 60 nm deep to about 100 nm deep.

8. The method of claim 1, wherein the etch pits are on average about 100 nm deep and about 500 nm in diameter.

9. The method of claim 1, wherein the deposited $Al_2O_3$, $TiO_2$, MgO, $HfO_2$, $SiO_2$, or $Si_3N_4$ is disposed such that it lines each etch pit at a thickness of about 15 nm to about 50 nm.

10. The method of claim 1, further comprising chemically oxidizing and removing $SiO_2$ from the silicon substrate before growing the first Ge film on the silicon substrate.

11. The method of claim 1, wherein growing the second Ge film is performed at conditions such that Ge growth is selective, and random nucleation of Ge does not take place on the lined etch pits, wherein the conditions are controlled to prevent the second Ge film from containing polycrystalline portions.

12. A method of forming a lattice-mismatched semiconductor device comprising:

growing epitaxially a first film comprising a crystalline material directly on a substrate, wherein the first film comprises an outer surface and a plurality of threading dislocations (TDs);

annealing the first film to the substrate at an annealing temperature in a range of from about 750° C. to about 900° C. before polishing the outer surface of the first film and before growing a second film over the first film;

after annealing the first film to the substrate and before etching the outer surface of the first film, polishing the outer surface of the first film, wherein at least some of the threading dislocations (TDs) intersect the polished outer surface;

after polishing the outer surface, etching the polished outer surface to create etch pits where the TDs intersect the polished outer surface, wherein each etch pit extends from the polished outer surface of the first film into the first film;

coating the etched outer surface by depositing a dielectric material thereon, thereby lining the etch pits with the dielectric material to produce lined etch pits;

coating the deposited dielectric material with a polymer, thereby filling the lined etch pits with the polymer;

etching the coated outer surface until a top portion of the etch pits is reached, thereby planarizing the outer surface and exposing the crystalline material surrounding the etch pits and the dielectric material and the polymer disposed within the etch pits;

removing the polymer in the etch pits following planarization of the outer surface, thereby exposing the lined etch pits;

after removing the polymer in the etch pits, growing the second film comprising at least one crystalline material by epitaxial lateral overgrowth (ELO) directly on the annealed first film.

13. The method of claim 12, wherein the crystalline materials in the first film and the second film are different and/or lattice-mismatched.

14. The method of claim 12, wherein the crystalline materials in the first film and the second film are the same.

15. The method of claim 12, further comprising growing at least one additional film comprising at least one crystalline material over the second film.

16. The method of claim 12, wherein a threading dislocation density (TDD) of the second film grown by ELO is between about $8\times10^5$ cm$^{-2}$ to about $2.7\times10^7$ cm$^{-2}$.

17. The method of claim 12, wherein the dielectric material is disposed, such that it lines each etch pit at a thickness of about 15 nm to about 50 nm.

18. The method of claim 12, further comprising annealing the second film grown by ELO.

19. A method of forming a lattice-mismatched semiconductor device comprising:

growing epitaxially a first film comprising a crystalline material directly on a substrate, wherein the first film comprises an outer surface and a plurality of threading dislocations (TDs);

annealing the first film to the substrate at an annealing temperature in a range of from about 750° C. to about 900° C. before polishing the outer surface of the first film and before growing a second film over the first film;

after annealing the first film to the substrate and before etching the outer surface of the first film, polishing the outer surface of the first film, wherein at least some of the threading dislocations (TDs) intersect the polished outer surface;

after polishing the outer surface, etching the polished outer surface to create etch pits where the TDs intersect the polished outer surface, wherein each etch pit extends from the polished outer surface of the first film into the first film;

coating the etched outer surface by depositing a dielectric material thereon, thereby lining the etch pits with the dielectric material to produce lined etch pits;

coating the deposited dielectric material with a polymer, thereby filling the lined etch pits with the polymer;

etching the coated outer surface until a top portion of the etch pits is reached, thereby planarizing the outer surface and exposing the crystalline material of the annealed first film surrounding the etch pits and the dielectric material and the polymer disposed within the etch pits;

removing the polymer in the etch pits following planarization of the outer surface, thereby exposing the lined etch pits;

after removing the polymer in the etch pits, selectively growing the second film comprising at least one crystalline material by epitaxial lateral overgrowth (ELO) directly on the annealed first film and the dielectric disposed within the etch pits at a growth temperature that precludes random nucleation of crystalline material on the dielectric disposed within the etch pits.

20. The method of claim 19, further comprising precluding the second film from containing polycrystalline portions.

* * * * *